United States Patent [19]

Kimura et al.

[11] Patent Number: 5,945,030

[45] Date of Patent: Aug. 31, 1999

[54] PIEZOELECTRIC CERAMIC COMPOSITION

[75] Inventors: Masahiko Kimura, Shiga-ken; Akira Ando, Omihachiman, both of Japan

[73] Assignee: Murata Maufacturing Co., Ltd., Japan

[21] Appl. No.: 09/111,351

[22] Filed: Jul. 7, 1998

[30] Foreign Application Priority Data

Jul. 9, 1997 [JP] Japan ..................................... 9-182904

[51] Int. Cl.$^6$ .......................... C04B 35/46; H01L 41/187
[52] U.S. Cl. ..................................... 252/62.9 R; 501/134; 501/136
[58] Field of Search ....................... 252/62.9 R; 501/134, 501/136

[56] References Cited

U.S. PATENT DOCUMENTS 5,369,068  11/1994  Kaneko ............................... 252/62.9 R Primary Examiner—C. Melissa Koslow
Attorney, Agent, or Firm—Ostrolenk, Faber, Gerb & Soffen, LLP

[57] ABSTRACT

Disclosed are piezoelectric ceramic compositions comprising, as the essential component, $(Na_{0.5}Bi_{0.5})Bi_4Ti_4O_{15}$, or $(Na_{0.5}Bi_{0.5})_{1-x}M_xBi_4Ti_4O_{15}$ where M is at least one divalent metal element or $(A1_{0.5}A2_{0.5})$ and A1 is at least one monovalent metal element, A2 is at least one trivalent metal element, and $0<x\leq0.5$, and, as the side component, manganese in an amount of from about 0.7 to 3.0% by weight, relative to the essential component and in terms of $MnCO_3$. The compositions have a piezoelectric constant, $d_{33}$, of not smaller than 25 pC/N at temperatures above 500° C.

16 Claims, No Drawings

PIEZOELECTRIC CERAMIC COMPOSITION

FIELD OF THE INVENTION

The present invention relates to piezoelectric ceramic compositions, in particular, to those for piezoelectric ceramic devices to be used at high temperature, i.e., above 500° C.

BACKGROUND OF THE INVENTION

Heretofore, piezoelectric ceramic compositions consisting essentially of lead titanate zirconate ($Pb(Ti_xZr_{1-x})O_3$ with $0<x<1$) or lead titanate ($PbTiO_3$) have been widely used for piezoelectric ceramic devices such as piezoelectric ceramic sensors. However, those piezoelectric ceramic compositions lose their piezoelectricity at temperatures above their Curie point, which is between 200 and 500° C. or so. Therefore, they could not be used as materials for piezoelectric ceramic sensors acting at temperatures above 500° C.

Compared with lead titanate zirconate and lead titanate, the Curie point of the layer-structured bismuth compound $Na_{0.5}Bi_{4.5}Ti_4O_{15}$ (hereinafter referred to as NBT) has a high value of about 670° C., and there is a hope of NBT piezoelectric materials usable at high temperatures. Other compositions derived from NBT by substituting a part of the moiety of NBT, ($Na_{0.5}Bi_{0.5}$), with any of Ca, Sr, Ba, Pb, ($K_{0.5}Bi_{0.5}$) or the like are also known as piezoelectric materials having a high Curie point.

However, piezoelectric ceramic compositions consisting essentially of such a layer-structured bismuth compound generally have a small piezoelectric constant, $d_{33}$, compared with those consisting essentially of lead titanate zirconate or lead titanate, and are therefore unsatisfactory for piezoelectric ceramic sensors that act on the basis of $d_{33}$, such as accelerometer sensors, etc.

Techniques of adding manganese to NBT or NBT-derived compositions produced by substituting a part of the NBT moiety, ($Na_{0.5}Bi_{0.5}$), with Ca (hereinafter referred to as NBCT) have been disclosed in a report "Piezoelectricity in Ceramics of Ferroelectric Bismuth Compound with Layer Structure" (by S. Ikegami and I. Ueda, in Japanese Journal of Applied Physics, 1974) and in a report of "Production of Grain-oriented Ceramics, Their Characteristic, and Their Applications to Electronic Materials" (by T. Takenaka and K. Sakata, in Ceramics, published by Ceramics Association of Japan, 1989). Ikegami et al. added manganese in the form of $MnO_2$ to NBT in an amount of 5 mol % of $MnO_2$ (that is, in an amount of about 0.42% by weight in terms of $MnCO_3$). However, they say nothing about any improvement in the piezoelectric characteristics of the compositions produced. Takenaka et al. added manganese to NBT and NBCT in an amount of from about 0.1 to 0.2% by weight in terms of $MnCO_3$. However, the composition of NBT to which was added 0.1% by weight of $MnCO_3$ has $d_{33}$ of 15.6 pC/N, and that of NBCT to which was added 0.2% by weight of $MnCO_3$ has $d_{33}$ of 20.8 pC/N. Thus, $d_{33}$ of the compositions of Takenaka et al. is still lower than the 25 pC/N which piezoelectric ceramic sensors require for practical application.

SUMMARY OF THE INVENTION

The object of the present invention is to provide piezoelectric ceramic compositions having a piezoelectric constant, $d_{33}$, of not lower than 25 pC/N at 500° C. or higher.

The piezoelectric ceramic composition of the first aspect of the invention comprises an essential component of a formula:

$$(Na_{0.5}Bi_{0.5})Bi_4Ti_4O_{15},$$

and a side component of manganese in an amount of from about 0.7 to 3.0% by weight relative to the essential component and in terms of $MnCO_3$.

The piezoelectric ceramic composition of the second aspect of the invention comprises an essential component of a general formula:

$$(Na_{0.5}Bi_{0.5})_{1-x}M_xBi_4Ti_4O_{15},$$

wherein M is at least one divalent metal element, and $0<x\leq0.5$, and a side component of manganese in an amount of from about 0.7 to 3.0% by weight relative to the essential component and in terms of $MnCO_3$.

These piezoelectric ceramic compositions of the invention have a Curie point of about 600° C., and therefore do not lose the piezoelectricity even at high temperatures above 500° C. In addition, they have a piezoelectric constant, $d_{33}$, of not lower than 25 pC/N, and are therefore well applicable to ceramic sensors and the like that require a large piezoelectric constant.

In the piezoelectric ceramic composition of the second aspect of the invention, M in the formula is preferably at least one of Ca, Sr, Ba and Pb. This is the third aspect of the invention. As comprising a divalent metal element of that type, the composition of the third aspect has a larger piezoelectric constant.

The piezoelectric ceramic composition of the fourth aspect of the invention comprises an essential component of a general formula:

$$(Na_{0.5}Bi_{0.5})_{1-x}(A1_{0.5}A2_{0.5})_xBi_4Ti_4O_{15},$$

wherein A1 is at least one monovalent metal element, A2 is at least one trivalent metal element, and $0<\leq0.5$, and a side component of manganese in an amount of from about 0.7 to 3.0% by weight relative to the essential component and in terms of $MnCO_3$. This piezoelectric ceramic composition of the invention has a Curie point of about 600° C., and therefore does not lose the piezoelectricity even at high temperatures above 500° C. In addition, it has a piezoelectric constant, $d_{33}$, of not lower than 25 pC/N, and is therefore well applicable to ceramic sensors and the like that require a large piezoelectric constant.

In the piezoelectric ceramic composition of the fourth aspect of the invention, A1 in the formula is preferably at least one of K and Li, and A2 therein is preferably Bi. This is the fifth aspect of the invention. As comprising the combination of monovalent and trivalent metal elements of that type, the composition of the fifth aspect a larger piezoelectric constant.

DESCRIPTION OF PREFERRED EMBODIMENTS OF THE INVENTION

The essential component of the piezoelectric ceramic compositions of the second through fourth aspects invention is NBT or an NBT derivative as formed by substituting a part of the NBT moiety, ($Na_{0.5}Bi_{0.5}$), with a divalent metal element or with monovalent and trivalent metal elements, in order that the Curie point of the compositions much higher than 500° C.

The substitution of a part of the NBT, ($Na_{0.5}Bi_{0.5}$), with such metal elements enlarges the piezoelectric constant of the compositions comprising the NBT derivative. The partial substitution of the moiety ($Na_{0.5}Bi_{0.5}$) must be so effected that the amount of the substituent element is not larger than that of ($Na0.5Bi_{0.5}$). The type of the element for the substitution is not limited to one, but a plurality of different types of elements may be used for the substitution.

The side component of the piezoelectric ceramic compositions of the invention is Mn in order to make the compositions have a piezoelectric constant, $d_{33}$, of not lower than 25 pC/N. Its content is from about 0.7 to 3.0% by weight relative to the essential component and in terms of $MnCO_3$ and preferably about 1 to 2% by weight.

Now, the invention is described in more detail hereinunder with reference to the following Examples, which, however, are not intended to restrict the scope of the invention.

EXAMPLE 1

First prepared were $Na_2CO_3$, $Bi_2O_3$, $TiO_2$ and $MnCO_3$ as the starting materials for piezoelectric ceramic compositions of the invention to be produced herein. These materials were weighed to give compositions of a compositional formula:

$$(Na_{0.5}Bi_{0.5})Bi_4Ti_4O_{15}+\alpha MnCO_3$$

where the unit $\alpha$ is % by weight, and mixed in wet in a ball mill for about 4 hours to obtain mixtures. Each mixture was dried and then calcined at 700 to 900° C. to obtain calcined products. Each calcined product was roughly ground, to which was added a suitable amount of an organic binder, wet-ground in a ball mill for 4 hours, and then sieved through a 40-mesh sieve to adjust the grain size of the resulting powder. Thus were obtained binder-containing mixtures. Next, each binder-containing mixture was shaped under a pressure of 1000 kg/cm² into columnar discs having a diameter of 12.5 mm and a thickness of 5 mm. These discs were baked in air to obtain columnar piezoelectric ceramic discs. A silver paste was applied onto the both surfaces of each disc in the ordinary manner, and baked to form silver electrodes on the surfaces. Then, these discs were polarized in an insulating oil at 150 to 200° C. while imparting thereto a direct current voltage of from 5 to 20 kV/mm for 10 to 30 minutes. Thus were obtained piezoelectric ceramic devices.

The Curie point and the piezoelectric constant, $d_{33}$, of those devices produced herein were measured and are shown in Table 1, in which the asterisked samples are outside the scope of the invention.

TABLE 1

| Sample No. | α (wt. %) | Curie Point (° C.) | $d_{33}$(pC/N) |
|---|---|---|---|
| *1 | 0.6 | 660 | 18 |
| 2 | 0.7 | 660 | 26 |
| 3 | 1.0 | 655 | 30 |
| 4 | 3.0 | 645 | 27 |
| *5 | 4.0 | 635 | Not polarized |
| Control Sample | 0.0 | 665 | 15 |

As seen in Table 1, it is obvious that the samples in Example 1 have a larger piezoelectric constant, $d_{33}$, than the control sample with no Mn added. In addition, it is confirmed that all the samples of the invention have a Curie point of above 600° C. and are therefore usable under high temperatures above 500° C.

The reasons why the amount of $MnCO_3$, $\alpha$, are specifically defined herein is mentioned below.

In the invention, $\alpha$ is defined to be $0.7 \leq \alpha \leq 3.0$. This is because if $\alpha$ is smaller than about 0.7% by weight as in sample No. 1, the piezoelectric constant, $d_{33}$, of the composition is unfavorably smaller than 25 pC/N.

On the other hand, if $\alpha$ is larger than about 3.0% by weight as in sample No. 5, the piezoelectric ceramic of the composition could not be polarized.

EXAMPLE 2

First prepared were $Na_2CO_3$, $Bi_2O_3$, $TiO_2$, CaO, SrO, BaO, PbO and $MnCO_3$ as the starting materials for piezoelectric ceramic compositions of the invention to be produced herein. These materials were weighed to give compositions of a compositional formula:

$$(Na_{0.5}Bi_{0.5})_{1-x}M_xBi_4Ti_4O_{15}+\beta MnCO_3$$

where M is at least one of Ca, Sr, Ba and Pb, and the unit of β is % by weight, and mixed in wet in a ball mill for about 4 hours to obtain mixtures.

These mixtures were processed in the same manner as in Example 1 to produce piezoelectric ceramic devices, for which the details are omitted herein.

The Curie point and the piezoelectric constant, $d_{33}$, of those devices produced herein were measured and are shown in Table 2, in which the asterisked samples are outside the scope of the invention.

TABLE 2

| Sample No. | M | x | β (wt. %) | Curie Point (° C.) | $d_{33}$(pC/N) |
|---|---|---|---|---|---|
| *11 | Ca | 0.1 | 0.6 | 670 | 20 |
| 12 | Ca | 0.1 | 0.7 | 670 | 29 |
| 13 | Ca | 0.1 | 1.0 | 665 | 35 |
| 14 | Ca | 0.1 | 3.0 | 655 | 29 |
| *15 | Ca | 0.1 | 4.0 | 645 | Not polarized |
| 16 | Ca | 0.3 | 1.0 | 680 | 30 |
| 17 | Ca | 0.5 | 1.0 | 695 | 26 |
| *18 | Ca | 0.6 | 1.0 | 700 | 16 |
| 19 | Sr | 0.1 | 1.0 | 635 | 32 |
| 20 | Ba | 0.1 | 1.0 | 620 | 37 |
| 21 | Pb | 0.1 | 1.0 | 645 | 38 |
| Control Sample | Ca | 0.1 | 0.0 | 670 | 18 |

As seen in Table 2, it is obvious that the samples of the invention in Example 2 have a larger piezoelectric constant, $d_{33}$, than the control sample with no Mn added. In addition, it is confirmed that all the samples containing any of Ca, Sr, Ba or Pb as M have a Curie point of above 600° C. and are therefore usable under high temperatures above 500° C.

The reasons why the value x and the amount of $MnCO_3$, β, are specifically defined herein are mentioned below.

In the invention, x is defined to be $0<x \leq 0.5$. This is because, if x is larger than about 0.5 as in Sample No. 18, the piezoelectric constant, $d_{33}$, of the composition is unfavorably smaller than 25 pC/N.

β is defined to be $0.7 \leq \beta \leq 3.0$. This is because if β is smaller than about 0.7 as in Sample No. 11, the piezoelectric constant, $d_{33}$, of the composition is unfavorably smaller than 25 pC/N.

On the other hand, if β is larger than about 3.0 as in sample No. 15, the piezoelectric ceramic of the composition could not be polarized.

EXAMPLE 3

First prepared were $Na_2CO_3$, $Bi_2O_3$, $TiO_2$, $K_2CO_3$, $Li_2CO_3$ and $MnCO_3$ as the starting materials for piezoelectric ceramic compositions of the invention to be produced herein. These materials were weighed to give compositions of a compositional formula:

$(Na_{0.5}Bi_{0.5})_{1-x}(A1_{0.5}A2_{0.5})_xBi_4Ti_4O_{15}+\gamma MnCO_3$ where A1 is at least one of K and Li, A2 is Bi, and the unit of $\gamma$ is % by weight, and mixed wet in a ball mill for about 4 hours to obtain mixtures.

These mixtures were processed in the same manner as in Example 1 to produce piezoelectric ceramic devices, for which the details are omitted herein.

The Curie point and the piezoelectric constant, $d_{33}$, of those devices produced herein were measured and are shown in Table 3, in which the asterisked samples are outside the scope of the invention.

TABLE 3

| Sample No. | A1 | A2 | x | γ (wt. %) | Curie Point (° C.) | $d_{33}$(pC/N) |
|---|---|---|---|---|---|---|
| *31 | K | Bi | 0.1 | 0.6 | 635 | 20 |
| 32 | K | Bi | 0.1 | 0.7 | 635 | 27 |
| 33 | K | Bi | 0.1 | 1.0 | 635 | 33 |
| 34 | K | Bi | 0.1 | 3.0 | 630 | 26 |
| *35 | K | Bi | 0.1 | 4.0 | 620 | Not polarized |
| 36 | K | Bi | 0.3 | 1.0 | 620 | 29 |
| 37 | K | Bi | 0.5 | 1.0 | 605 | 26 |
| *38 | K | Bi | 0.6 | 1.0 | 585 | 15 |
| 39 | Li | Bi | 0.1 | 1.0 | 635 | 31 |
| Control Sample | K | Bi | 0.1 | 0.0 | 640 | 17 |

As shown in Table 3, it is obvious that the samples of the invention in Example 3 have a larger piezoelectric constant, $d_{33}$, than the control sample with no Mn added. In addition, it is confirmed that all the samples of the invention containing K or Li as A1 can be formed into piezoelectric ceramic devices having a piezoelectric constant of not smaller than 25 at 500° C. or higher.

The reasons why the value x and the amount of $MnCO_3$, $\gamma$, are specifically defined herein are mentioned below.

In the invention, x is defined to be $0<x\leq 0.5$. This is because if x is larger than about 0.5 as in Sample No. 38, the piezoelectric constant, $d_{33}$, of the composition is unfavorably smaller than 25 pC/N.

$\gamma$ is defined to be $0.7\leq\gamma\leq 3.0$. This is because if $\gamma$ is smaller than about 0.7 as in Sample No. 31, the piezoelectric constant, $d_{33}$, of the composition is unfavorably smaller than 25 pC/N.

On the other hand, if $\gamma$ is larger than about 3.0 as in sample No. 35, the piezoelectric ceramic of the composition could not be polarized.

Having been mentioned in detail hereinabove, the piezoelectric ceramic compositions of the invention, which comprise, as the essential component having a Curie point of at least about 600° C., $(Na_{0.5}Bi_{0.5})Bi_4Ti_4O_{15}$, or $(Na_{0.5}Bi_{0.5})_{1-x}M_xBi_4Ti_4O_{15}$ (where M is at least one divalent metal element and $0<x\leq 0.5$), or $(Na_{0.5}Bi_{0.5})_{1-x}(A1_{0.5}A2_{0.5})_xBi_4Ti_4O_{15}$ (where A1 is at least one monovalent metal element, A2 is at least one trivalent metal element and $0\leq y\leq 0.5$), and, as the side component, manganese in an amount of from about 0.7 to 3.0% by weight, relative to the essential component and in terms of $MnCO_3$, have a piezoelectric constant, $d_{33}$, of not smaller than 25 pC/N at temperatures above 500° C.

While the invention has been described in detail and with reference to specific embodiments thereof, it will be apparent to one skilled in the art that various changes and modifications can be made therein without departing from the spirit and scope thereof.

What is claimed is:

1. A piezoelectric ceramic composition comprising an essential component of general formula:

$(Na_{0.5}Bi_{0.5})_{1-x}M_xBi_4Ti_4O_{15}$, wherein M is at least one divalent metal element or $(A1_{0.5}A2_{0.5})$, A1 is at least one monovalent metal element, A2 is at least one trivalent metal element and $0\leq x\leq 0.5$, and manganese in an amount of from about 0.7 to 3.0% by weight relative to the essential component and in terms of $MnCO_3$.

2. A piezoelectric ceramic composition as claimed in claim 1, in which x is 0.

3. A piezoelectric ceramic composition as claimed in claim 2, in which the amount of manganese is from about 1 to 2% by weight relative to the essential component and in terms of $MnCO_3$.

4. A piezoelectric ceramic composition as claimed in claim 1, in which x is greater than 0.

5. The piezoelectric ceramic composition as claimed in claim 4, in which M is at least one divalent metal selected from the group consisting of Ca, Sr, Ba and Pb.

6. The piezoelectric ceramic composition as claimed in claim 5, in which M is Ca.

7. A piezoelectric ceramic composition as claimed in claim 6, in which the amount of manganese is from about 1 to 2% by weight relative to the essential component and in terms of $MnCO_3$.

8. A piezoelectric ceramic composition as claimed in claim 5, in which the amount of manganese is from about 1 to 2% by weight relative to the essential component and in terms of $MnCO_3$.

9. A piezoelectric ceramic composition as claimed in claim 4, in which the amount of manganese is from about 1 to 2% by weight relative to the essential component and in terms of $MnCO_3$.

10. A piezoelectric ceramic composition as claimed in claim 4 in which M is $(A1_{0.5}A2_{0.5})$ and is expressed by the general formula:

$(Na_{0.5}Bi_{0.5})_{1-x}(A1_{0.5}A2_{0.5})_xBi_4Ti_4O_{15}$.

11. The piezoelectric ceramic composition as claimed in claim 10, in which A1 is at least one of K and Li, and A2 is Bi.

12. The piezoelectric ceramic composition as claimed in claim 11, in which A1 is K.

13. A piezoelectric ceramic composition as claimed in claim 12, in which the amount of manganese is from about 1 to 2% by weight relative to the essential component and in terms of $MnCO_3$.

14. A piezoelectric ceramic composition as claimed in claim 11, in which the amount of manganese is from about 1 to 2% by weight relative to the essential component and in terms of $MnCO_3$.

15. A piezoelectric ceramic composition as claimed in claim 10, in which the amount of manganese is from about 1 to 2% by weight relative to the essential component and in terms of $MnCO_3$.

16. A piezoelectric ceramic composition as claimed in claim 1 having a Curie point above 600° C. and a $d_{33}$ of at least 26 pC/N.

* * * * *